US006433626B1

(12) United States Patent
Guimaraes

(10) Patent No.: US 6,433,626 B1
(45) Date of Patent: Aug. 13, 2002

(54) CURRENT-MODE FILTER WITH COMPLEX ZEROS

(75) Inventor: Homero L. Guimaraes, Gurnee, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/761,085

(22) Filed: Jan. 16, 2001

(51) Int. Cl.[7] .................................................. H03B 1/00

(52) U.S. Cl. ....................................... 327/552; 327/553

(58) Field of Search ................................ 327/552, 553, 327/554, 555, 556, 557, 558, 559, 167, 334, 335, 336; 330/303, 306

(56) References Cited

U.S. PATENT DOCUMENTS

| | | | | |
|---|---|---|---|---|
| 3,723,770 A | | 3/1973 | Ryan | 307/256 |
| 4,340,868 A | | 7/1982 | Pace | 330/294 |
| 4,823,092 A | * | 4/1989 | Pennock | 330/253 |
| 4,843,343 A | | 6/1989 | Pace | 330/257 |
| 5,661,432 A | * | 8/1997 | Chang et al. | 327/552 |
| 6,011,431 A | * | 1/2000 | Gilbert | 327/553 |
| 6,084,470 A | * | 7/2000 | Shiramatsu et al. | 330/303 |

OTHER PUBLICATIONS

Durand, "Odd–Order Current–Mode Lowpass Filters with Finite Zeros", IEEE Proceedings, XII Symposium on Integrated Circuits and Systems Design, 1999, pp. 60–63.

Durand, "Low–Voltage Current–Mode Filters", IEEE 39$^{th}$ Midwest Symposium on Circuits and Systems, 1996, vol. 2, pp. 911–914.

Smith et al., "3V High–Frequency Current–Mode Filters", IEEE Intl. Symposium on Circuits and Systems, 1993, vol. 2, pp. 1459–1462.

Calôba et al., "OTA–C Filters with Finite Zeros and Without Floating Capacitors", IEEE 39$^{th}$ Midwest Symposium on Circuits and Systems, 1996, vol. 2, pp. 925–928.

Toumazou et al., "Analogue IC Design: The Current Mode Approach", Peter Peregrinus Ed., 1990, Chap. 2, pp. 56–61.

* cited by examiner

*Primary Examiner*—Matthew Smith
*Assistant Examiner*—Paul Dinh
(74) *Attorney, Agent, or Firm*—Brian M. Mancini

(57) ABSTRACT

A current-mode filter with a transfer function having complex zeros includes a voltage differentiator having first and second bipolar transistors with respective first and second inputs and outputs and being coupled in an emitter follower configuration. A floating capacitor is coupled between the first and second outputs of the voltage differentiator. The floating capacitor forms a finite zero in the transfer function of the filter. At least one current mirror, isolated from the floating capacitor, is coupled to the voltage differentiator so as to substantially cancel any signal non-linearities introduced by the emitter follower configuration.

16 Claims, 5 Drawing Sheets

—PRIOR ART—

CURRENT-MODE FILTER WITH COMPLEX ZEROS

FIELD OF THE INVENTION

This invention relates generally to current mode filters, and more particularly to current mode filters implementing finite zeros.

BACKGROUND OF THE INVENTION

Current-mode filters have been used in radiocommunication architectures to detect digital signals. In general, current mode filters use current mirrors to amplify current. Previously, voltage mode filters were used but were limited in their speeds, becoming less useful at higher operating frequencies. This is because, in the voltage mode, signals were sent as voltage levels thus being affected by parasitic capacitances and due to this effect, limiting higher frequency signals. In contrast, current-mode filters are able to operate at higher frequencies with less bandwidth limitations, since signals are sent as currents that are not sensitive to the parasitic capacitances present in a typical IC layout. This is used to advantage in low-noise baseband matched filters.

Typically, in any receiver line-up there will be either an anti-aliasing filter or a matched filter in front of an A/D converter. In previous radio communication devices the filter was implemented either using a GmC continuous time filter or Active RC topologies, as are known in the art. GmC filters are known for having a high equivalent input noise, which in turn requires a high take-over gain in the previous receiver stages. In addition, this high gain reduces the 3rd-order intermodulation product (IP3) of the receiver line-up. On the other hand, Active-RC filters have very good noise properties, but require a higher bias current to move the non-dominant poles away from the operating frequencies of radio communication device. This becomes more critical as the bandwidth of the filter is increased.

GmC and Active RC filters have been implemented with finite zeros to improve performance. Most cellular telephone channel filters employ elliptic approximations that, incorporate some form of subcircuit to generate the complex zeros necessary to implement the elliptic transfer function. This normally leads to floating capacitors in the case of GmC filters. However, this results in parasitic capacitances due to interconnection and other devices being added to each side of this floating capacitor making the transfer function dependent on the parasitic capacitance. The techniques used to create finite zeros in a GmC topology cannot be applied to current-mode filters.

Most prior art current-mode filters only describe all-poles filters. However, one alternative approach for implementing a zero in a current-mode topology uses an algebraic manipulation of the state equation to eliminate the effect of floating capacitors. This manipulation requires the use of a grounded capacitor and requires further circuit complexity by the addition of more current mirror circuits. Unfortunately, additional current mirror circuits drain more current in the radio communication device. Moreover, this alternative approach utilizes integer current mirrors ratios to adjust the transfer function, which limits the accuracy of adjustment.

What is needed is a current-mode filter with finite zeros that drains a lower current and is not limited by the use of integer-ratio current mirrors. In particular, it is desirable to save circuit power by reducing the need to use any additional current mirror circuits. It would also be beneficial to provide this improvement while also increasing performance.

DETAILED DESCRIPTION OF THE PREFERRED EMBODIMENT

The present invention provides an improved current-mode filter by including a floating capacitor circuit to generate a pair of complex zeros in such a way to enable the building of elliptic filters. In addition, the present invention uses a translinear circuit to increase the flexibility of the filter, without having to rely on additional current mirror circuits that drain excessive current, and without having to depend on integer current mirror ratios. As a result, a current-mode filter is provided that has less noise than a GmC filter and drains less current than an Active-RC filter, constituting an excellent alternative for high frequency filters. In addition, the low noise of the present invention allows for the use of less take-over gain thereby improving linearity and reducing dissipated power. The two terminals of the floating capacitor used in the present invention are connected to two low-impedance nodes in such a way that any parasitics from the low-impedance nodes have negligible effect on the transfer function.

Advantageously, since the signal in a current-mode filter is a current instead of a voltage, any parasitic capacitances do not impact the performance of the filter seriously. In particular, most of the nodes of the filter network are connected to current mirrors that present a low impedance with correspondingly high poles. Low impedance also makes it harder for the coupling of noise through parasitic capacitances. Another result is a wide dynamic range (since the signal being a current is not limited by supply voltage) with a tighter grouping of network component values, which is advantageous for an IC implementation of the invention. Moreover, the extended dynamic range allows its use in newer cellular radiotelephone systems that have to cope with higher levels of interference.

Typically, prior art current-mode filters do not deal effectively with finite zeros (LC tanks) and instead implement only poles. This is because only lossy integrators are possible, and when the state equations are manipulated to include this lossy effect in a finite zero transfer function, a current differentiation appears which is not feasible. The present invention addresses this problem by performing a voltage differentiation across a floating capacitor. Also, any non-linearity introduced at an emitter follower of the voltage differentiator, caused by a finite output impedance of the emitter follower current source, is canceled by a separate circuit which is not directly coupled to the voltage differentiator floating capacitor.

Figure 1:
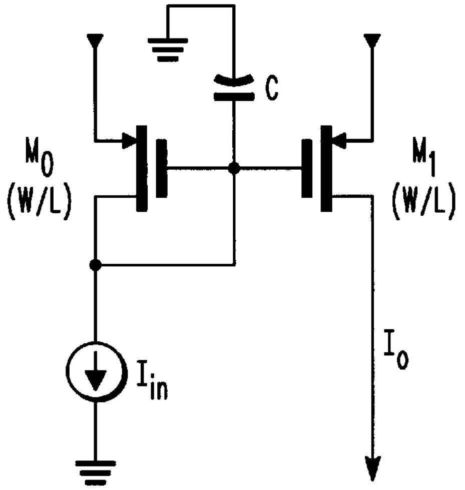
FIG. 1 shows a schematic diagram of a current mirror integrator known in the art.

The principle of current-mode filters is to use current mirrors to amplify, add and integrate current so that a transfer function can be created. The most important block in the analog filtering domain is the integrator as shown in FIG. 1 where it is assumed that the two MOSFETs have the same size ($M_0=M_1$). The first problem faced when trying to integrate current in a current mirror is the presence of a lossy integrator (a single real pole transfer function) as represented by:

$$I_o = \left(\frac{1}{s\frac{C}{g_m}+1}\right) I_{in}$$

$$I_{in} = I_o\left(s\frac{C}{g_m}+1\right) = I_o(s\tau+1)$$

It is necessary to either algebraically manipulate the transfer function to implement it by using lossy integrators (as opposed to loss-less integrators as are used in prior art ActiveRC filters) or to use some other technique to create a loss-less integrator. The present invention uses positive feedback to create a loss-less integrator.

Figure 2:
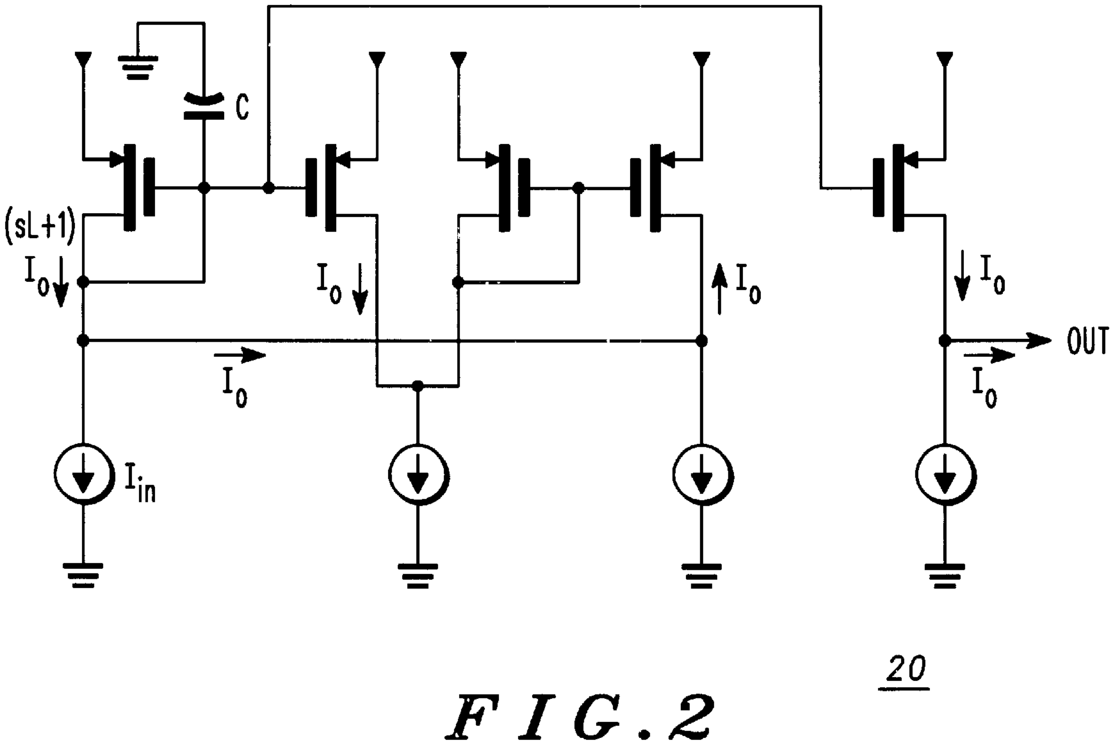
FIG. 2 shows a schematic diagram of a current mirror integrator using feedback.
Figure 3:
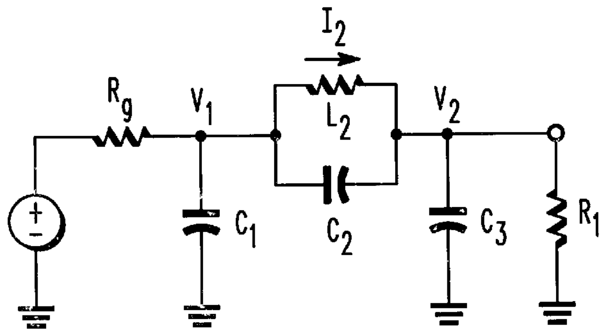
FIG. 3 shows a schematic diagram of a RLC network for a 3rd-order filter.

FIG. 2 shows the lossy integrator circuit 20, and its basic state equations are represented:

$$(sL+1)I_0 = I_0 + I_{in}$$

$$sLI_0 = I_{in} \Rightarrow I_0 = \frac{1}{sL} I_{in}$$

providing an ideal integrator (1/sK) usable in any active filter topology. The letter L is used instead of the factor ($C/g_m$) introduced in FIG. 1. The current directions shown in FIG. 2 are not the DC currents but the AC incremental currents with the output current being taken at the Terminal Out. As is known in the art, a ladder structure provides a low sensitivity regarding components and is incorporated into the present invention. As an example, a $3^{rd}$-order RLC ladder filter is shown in FIG. 3. The RLC network can be synthesized from any given poles and zeros or using tables for the more common approximations. From the RLC network, the state equations are $$sC_1 = \left(\frac{V_{in}-V_1}{R_g}\right) - I_2 - sC_2(V_1 - V_2)$$

$$sL_2 = V_1 - V_2$$

$$sC_3 = I_2 - \frac{V_2}{R_l} - sC_2(V_2 - V_1)$$

and it can be re-arranged as:

$$s(C_1+C_2)V_1 = \frac{V_{in}}{R_g} - \frac{V_1}{R_g} - I_2 + sC_2V_2$$

$$sL_2I_2 = V_1 - V_2$$

$$s(C_3+C_2)V_2 = I_2 + sC_2V_1 - \frac{V_2}{R_l}$$

The above equations show the effect of the floating capacitor $C_2$ that creates the finite zero as the two complex terms sCxVx appended on the right side of the first and third equations. In prior art GmC filters, finite zeros are created by physically placing a floating capacitor between the nodes, which causes the parasitic problems already discussed. However, in the present invention using a current-mode filter, currents must be converted to voltages before being applied to a capacitor. This is accomplished by inserting a resistor to create a voltage drop proportional to the current signal. The resulting modified state equations become:

$$sC_1V_1 = \left(\frac{V_{in}-V_1}{R_g}\right) - I_2 - sC_2(V_1 - V_2)$$

$$sL_2I_2 = V_1 - V_2$$

$$sC_3V_2 = I_2 - \frac{V_2}{R_l} - sC_2(V_1 - V_2)$$

$$\Downarrow$$

$$sC_1R_gV_1 = V_{in} - V_1 - I_2R_g - sC_2R_g(V_1 - V_2)$$

$$sL_2I_2 = V_1 - V_2$$

$$sC_3R_lV_2 = I_2R_l - sC_2R_l(V_2 - V_1) - V_2$$

$$\Downarrow$$

$$(sC_1R_g+1)V_1 = V_{in} - V_1 - I_2R_g - sC_2R_g(V_1 - V_2)$$

$$sL_2I_2 = V_1 - V_2$$

$$(sC_3R_l+1)V_2 = I_2R_l - sC_2R_l(V_2 - V_1)$$

where the resulting first and third equations are rearranged in the lossy form of integration (no feedback) and the second equation will use the ideal form of integrator (with feedback). This way of re-arranging the equations will simplify the circuit as will be shown below. It should be noted that the two differential terms are multiplied by different constants ($R_1$ and $R_g$), which can be simplified by considering $R_g=KR_1$ and scaling the networks accordingly. These equations also consider that current mirror integrators invert the signal at the output.

Figure 4:
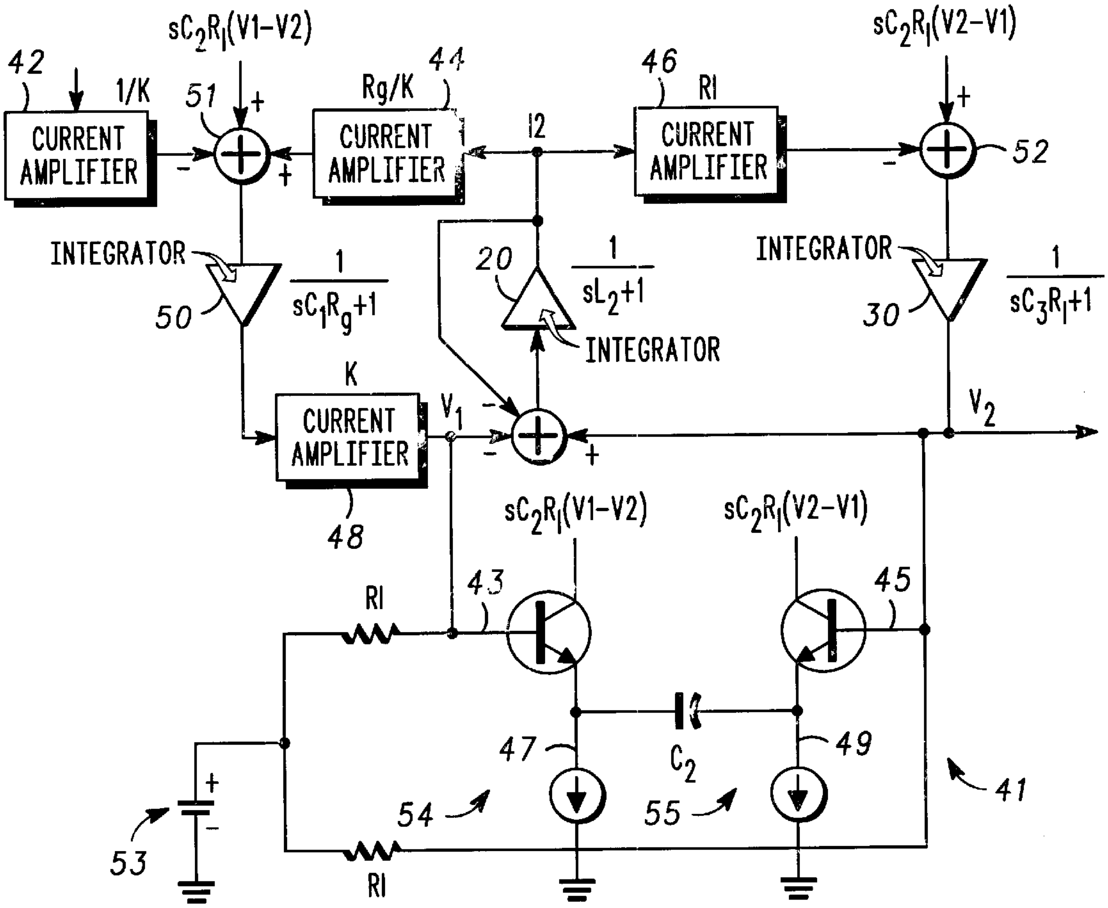
FIG. 4 shows a schematic diagram of the filter of FIG. 3 implemented as a current mode filter with finite-zero generating circuit, in accordance with the present invention.

FIG. 4 shows a block diagram of a current-mode filter implementation of FIG. 3 with a novel finite zero-generator circuit, in accordance with the present invention. This circuit is arrived at by substituting $R_g=KR_1$ and manipulating (scaling) the equations accordingly so that both finite zero terms have $sC_2R_1$(Vx−Vy). This scaling is implemented in the circuit by current amplifiers 42,44,46,48.

Specifically, the current-mode filter of the present invention includes a finite zero-generator circuit 41 with a voltage differentiator having first and second transistors with respective first and second inputs 43, 45 and outputs 47, 49 and being coupled in an emitter-follower configuration. The transistors can be MOS or a bipolar devices (as shown) connected in a source (emitter) follower. The collector currents, which are proportional to the term $sC_2R_1(V_x-V_y)$ are routed via current mirrors (not shown in the simplified block diagram in FIG. 4) to the adders 51 and 52. Since currents are being added, in practice those two adders are simply two nodes where the currents are added. A floating capacitor $C_2$ is coupled between the first and second outputs 47, 49 of the voltage differentiator. The floating capacitor forms a finite zero in the transfer function of the filter. Inasmuch as the filter is implemented in a current mode, the first and second inputs 43, 45 of the voltage differentiator are coupled with bias resistors $R_l$ so as to generate the two voltage inputs from current signals.

Preferably, at least one current mirror is coupled to the voltage differentiator but is isolated from the floating capacitor such that the at least one current mirror substantially subtracts any signal non-linearities introduced by the source (emitter) follower configuration of the voltage differentiator. More preferably, the at least one current mirror includes two current mirrors (62, 64 in FIG. 6) coupled to drive each collector of the voltage differentiator transistors.

The remaining circuits of the filter include three integrators 20, 30, 50, implemented by an integrator as represented in FIG. 2. A first integrator 50 drives the first input of the voltage differentiator and a third integrator 30 drives the second input of the voltage differentiator. The first and third integrator 50, 30 are configured in a lossy configuration while the second integrator 20 is configured in a feedback configuration as required by the state equations shown previously. In particular, and referring back to FIG. 3, the first integrator 50 provides a current into node $V_1$ which also corresponds to the first state equation derived above. The third integrator 30, provides the current into node $V_2$ which corresponds to the third state equation derived above. The second integrator 20 provides an ideal function describing the differential current $I_2$ between nodes $V_1$ and $V_2$, and corresponds the second state equation derived above. The voltage source 53 biases the base of the differentiator transistors while the current sources 54,55 set the bias currents at the same devices.

The present invention also includes current amplifiers 42,44,46,48. The current amplifiers 44, 46 are coupled to an output of the second integrator 20, as shown in FIG. 4. The current amplifiers 42, 44, 46 are configured to scale the inputs of the first and third integrators such that the integrator functions are defined in terms of the same bias resistance $R_I$ of the voltage differentiator. Although prior art multipliers have been implemented using current mirrors, that approach restricted the scaling to small, integer numbers only. In the present invention, translinear cells are used to amplify the current by a non-integer (or integer) factor determined by the ratio of two given currents. This allows a greater flexibility in setting and adjusting the scaling factor by simply changing a bias current. In particular, an internal current can be fixed, thereby allowing a single external bias current to be used to supply any amplifier ratio.

Figure 5:
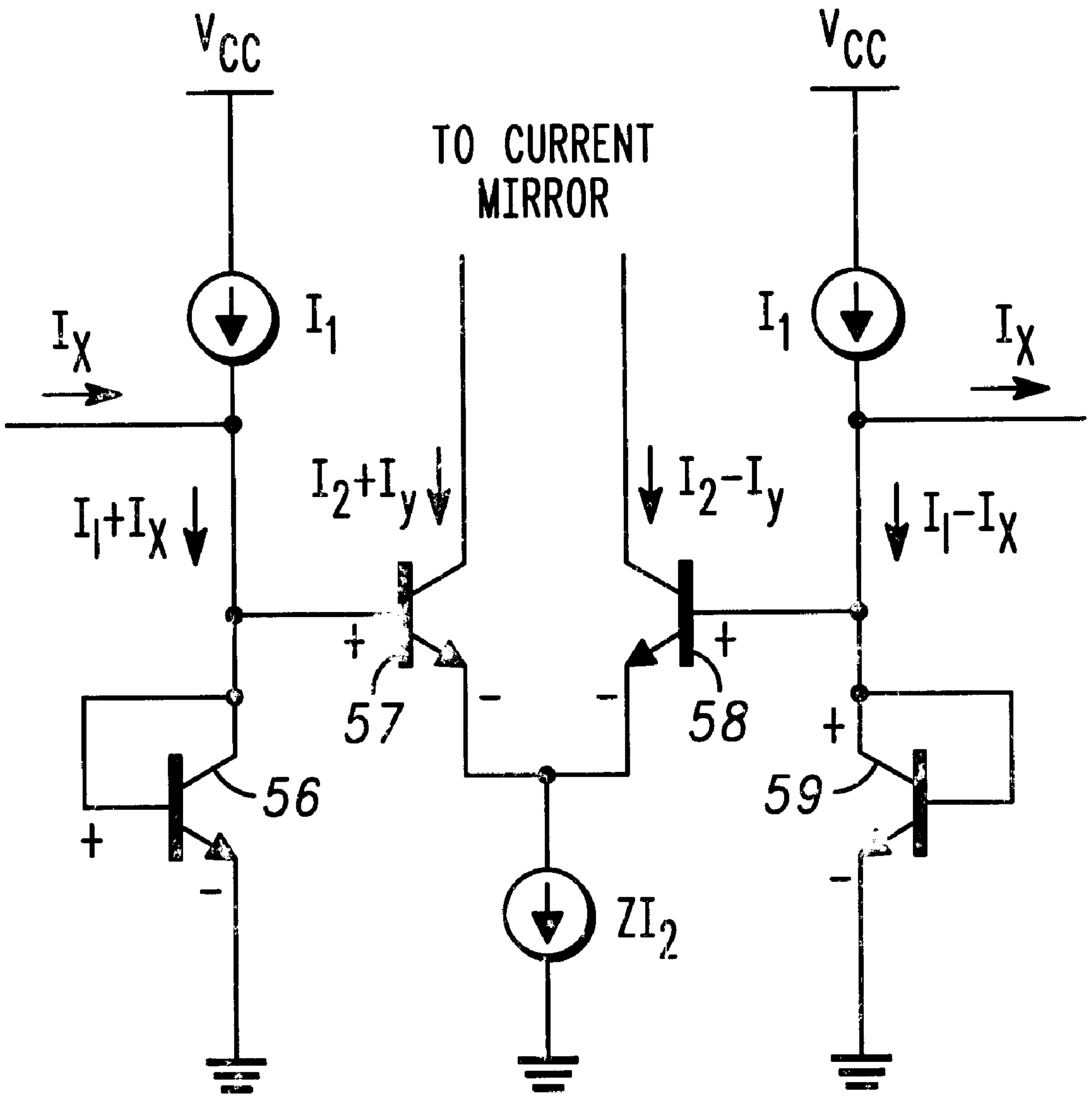
FIG. 5 shows a schematic diagram of a non-integer current amplifier used in accordance with the present invention.

FIG. 5 shows circuitry in the translinear current amplifier that provides non-integer current gain, as is used in the present invention. It is a beta insensitive translinear cell where the current gain is set by the ratio I2/I1, and is externally programmable. This current amplifier is based on a Gilbert-cell multiplier where a loop of base emitter junctions consist of the transistors 56,57,58,59, each pair subject to a different bias current (I2 and I1). For example, assume a differential input current, Ix, and a differential output current, Iy, flowing in the inner differential pair. Assuming that all four transistors have the same area (and thus the same saturation current Is) and using the bipolar transistor equation, Ic=Is.exp(Vbe/Vt)), the voltage equation for this loop is:

$$Vt.\ln\left(\frac{I1+Ix}{Is}\right)-Vt.\ln\left(\frac{I2+Iy}{Is}\right)+Vt.\ln\left(\frac{I2-Iy}{Is}\right)-Vt.\ln\left(\frac{I1-Ix}{Is}\right)=0$$

which simplifies to:

$$Iy=\left(\frac{I2}{I1}\right)\cdot Ix$$

Therefore, if I1 is set internally to the circuit, I2 can be adjusted externally to get the exact multiplication needed (integer or fractional). The output is taken by calculating the difference between (I2+Iy) and (I2−Iy) using a current mirror. This multiplier is used to implement the blocks 42,44,46,48 in FIG. 4. The flexibility provided in setting the multipliers results in an increased flexibility in creating accurate filter transfer functions. The approach used in the present invention is therefore free of the integer-only multiplication limitation in the prior art. Moreover, this ratio can be used to adjust the filter transfer function interactively and dynamically.

Figure 6:
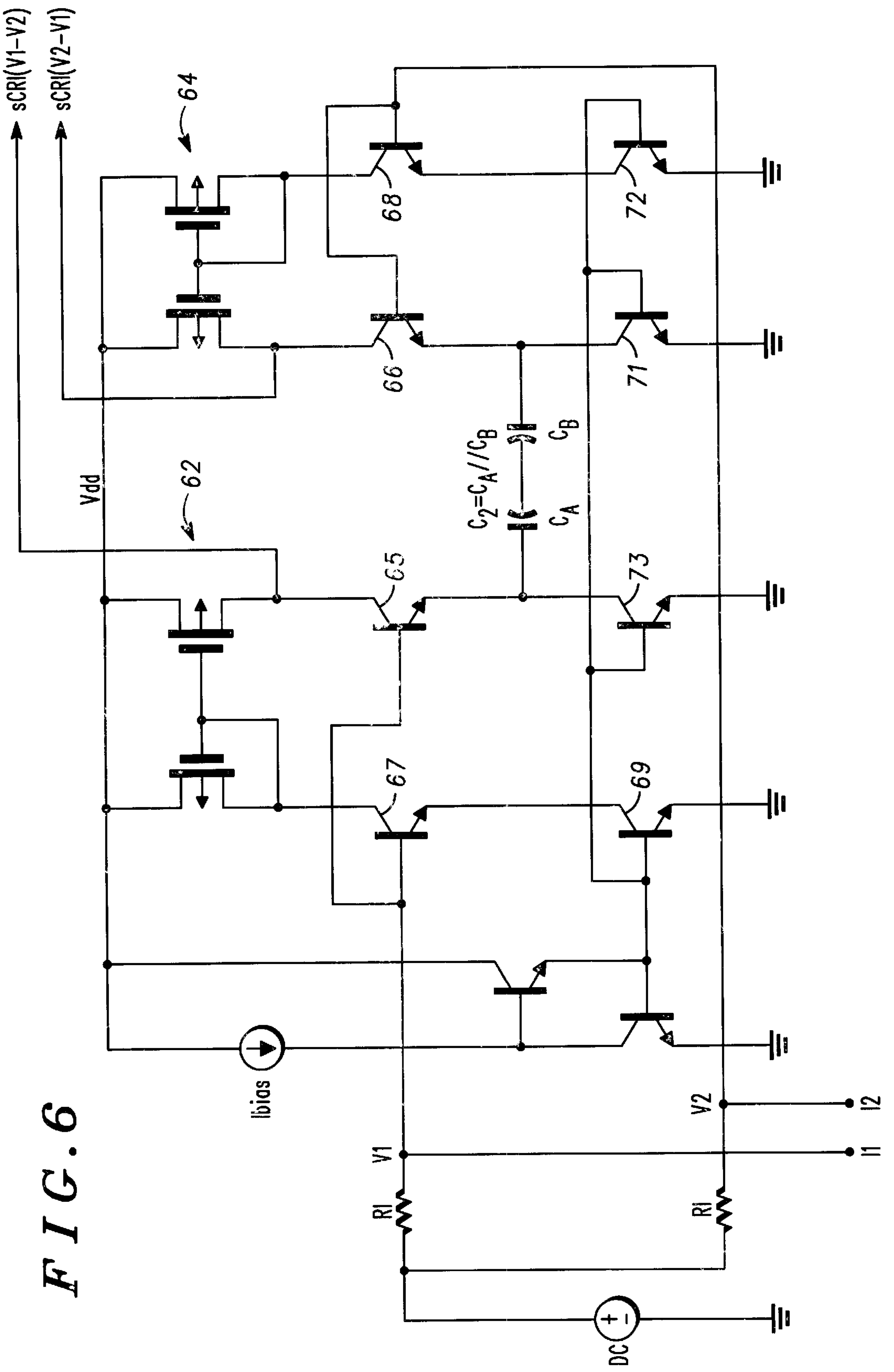
FIG. 6 shows a schematic diagram of preferred embodiment of a current mode filter with finite-zero generating circuit, in accordance with the present invention.

FIG. 6 shows a preferred embodiment of the circuit created to implement a current-mode filter with a finite zero, in accordance with the present invention. Note that there are two bipolar transistor branches in parallel on each side, but only one (the pair 65,66) has its emitter connected to the (equivalent) floating capacitor. The other bipolar transistor pair (67,68) is used to apply the same Vce in a similar current mirror transistors (formed by 69 and 72) and any excess current due to the non-linear early effect on the main current mirror (formed by 73 and 71) will be subtracted from the output current by the PMOS current mirrors 62 and 64. The net effect is that any non-linearity due to the bipolar transistor's early effect can be compensated. This improves the quality factor (Q) of the finite zero.

In particular, it should be recognized that bipolar transistors 71 and 73 have a non-linear impedance, $R_0$, between their associated collector and emitter and this resistance appears in parallel with the ideal current source. Considering that the full swing of the signal appears over $R_0$, it is apparent that this causes a nonlinear current that would cause a distortion in the desired current through capacitors Ca, Cb, appearing as part of the collector current of transistor 66. However, by using the second bipolar transistor branch of transistors 68 and 72 (matched with transistors 66 and 71) a copy of the non-linear portion of this current is created and subtracted from the collector current of transistor 66 (thus eliminating the non-linear portion of current) using the current subtraction enabled by the current mirrors formed by the two PMOS transistors indicated as 64. Since the circuit is differential (symmetrical) the same explanation applies to the transistors on the other side. As a result, the whole voltage differentiator has this cancellation property.

EXAMPLE

Figure 7:
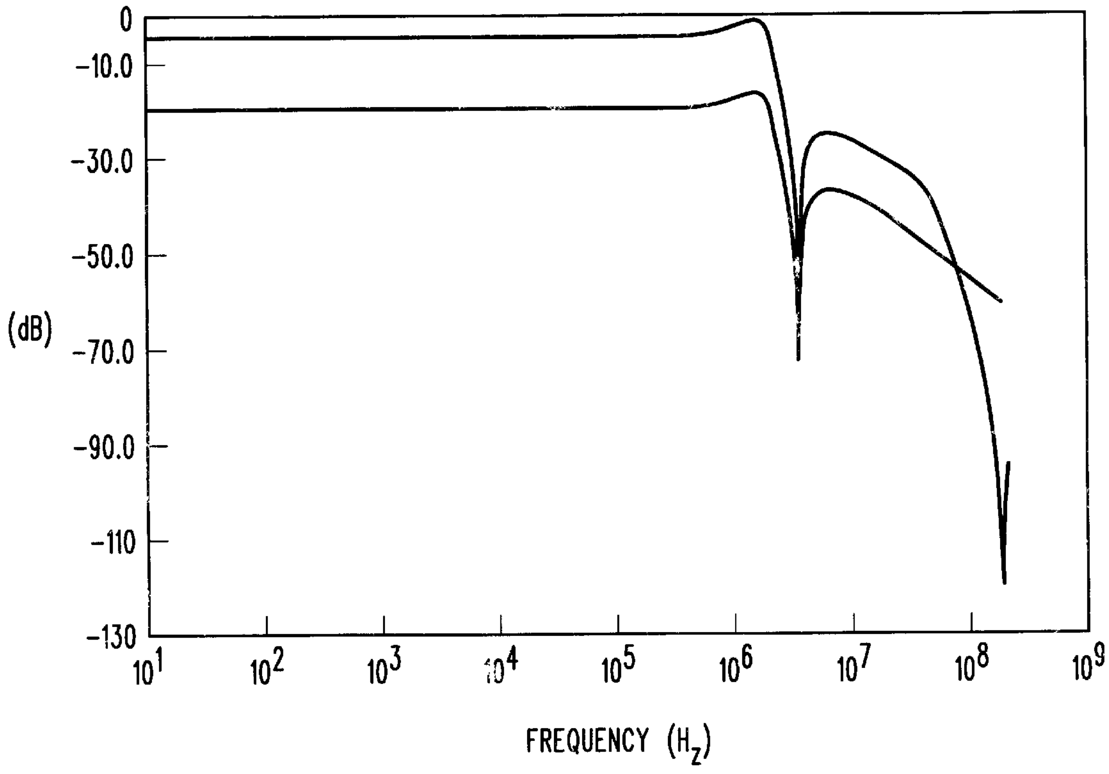
FIG. 7 shows a graphical representation of the performance of the filter of FIG. 6.

To confirm the performance of the present invention, a 3rd order current-mode filter was designed and simulated to compare its frequency response with the ideal RLC circuit. The preferred embodiments of FIGS. 4 and 6 were utilized and compared to a standard RLC model as represented in FIG. 3. FIG. 7 shows the results of this comparison showing the frequency response of the preferred embodiment of the present invention and the ideal RLC circuit frequency response. As can be seen, the curves closely match despite a change in gain due to the scaling until the parasitic poles roll-off at the higher frequencies. In addition, a simulation was performed comparing the characteristics of a 3rd order filter using the GmC techniques versus the filter of the present invention.

Table 1 compares the simulated characteristics of two similar filters, one using the GmC technique and the other one the current-mode filter with finite zero in accordance with the present invention. It is found that the GmC filter dissipates about 4 mA of current in comparison to 2 mA for the filter of the present invention. The intercept points had absolute numbers in units of current and were converted to dBm (at 50 ohms) as they were voltages, in order to facilitate the calculation of dynamic range.

TABLE 1

Filter performance Comparison

| Parameter Eq. noise @ output BW = 2.048 Mhz | Gm-C 6.14e−13 $A^2$ (BW = 2.048 Mhz) | Current Mirror 1.64e−14 $A^2$ (BW = 2.048 Mhz) |
|---|---|---|
| IIP3 | −60.1 dBm | −66.9 dBm |
| IIP2 | −43.3 dBm | −61.6 dBm |
| −1 dB Point | −79 dBm | −80.8 dBm |
| SFDR (best) | 34.67 dB | 40.6 dB |

From Table 1 it can be seen that the current-mode filter of the present invention has lower noise and a higher dynamic range and uses half the current when compared to the GmC type filter. It should be noted that the lower intercept point number IP3 can be improved by raising the bias current. However, it should be recognized that there is a trade off with current drain.

In review, the present invention provides a current-mode filter that includes a floating capacitor to generate a finite zero in a transfer function of the filter. In addition, translinear circuits are utilized to provide non-integer amplification factors without the need for additional circuits.

The key advantages of the present invention are less noise than a GmC filter and less current drain than an Active-RC filter. In addition, the low noise of the present invention allows for the use of less take-over gain thereby improving linearity and reducing dissipated power.

While specific components and functions of the decoding of current mode filter are described above, fewer or additional functions could be employed by one skilled in the art within the broad scope of the present invention. The invention should be limited only by the appended claims.

What is claimed is:

1. A current-mode filter with a transfer function having complex zeros, comprising:

a voltage differentiator having first and second transistors with respective first and second inputs and outputs and being coupled in a follower configuration, third and fourth transistors on second branches are coupled to the first and second transistors respectively and are substantially matched thereto;

a floating capacitor coupled between the first and second outputs of the voltage differentiator, the floating capacitor forming a finite zero in the transfer function of the filter; and two current mirrors isolated from the floating capacitor, each current mirror coupled to drive each collector the voltage differentiator transistors and also coupled to the associated second branch transistors, the two current mirrors subtract a non-linear signal from the associated second branched transistors to substantially cancel any signal non-linearities introduced by the follower configuration.

2. The filter of claim 1, wherein the first and second inputs of the voltage differentiator are coupled with bias resistors so as to generate voltage differentiation from current signals.

3. The filter of claim 1, wherein the transistors are bipolar in an emitter follower configuration.

4. The filter of claim 2, further comprising three integrators, a first integrator driving the first input of the voltage differentiator and a third integrator driving the second input of the voltage differentiator, the first and third integrator configured in a lossy configuration, a second integrator is driven by the voltage differentiation and is configured in a feedback configuration.

5. The filter of claim 4, further comprising current amplifiers coupled to an output of the second integrator, the current amplifiers are configured to scale the inputs of the first and third integrators such that the integrator functions are defined in terms of the same bias resistance of the voltage differentiator.

6. The filter of claim 5, wherein the current amplifiers are translinear current amplifiers.

7. The filter of claim 5, wherein an amplification factor of the current amplifiers is determined by the ratio of two input currents such that the amplification factor can be an integer and a non-integer value, and wherein at least one of the two inputs currents is externally supplied.

8. A current-mode filter with a transfer function having complex zeros, comprising:

a voltage differentiator having first and second bipolar transistors with respective first and second inputs and outputs and being coupled in an emitter follower configuration;

bias resistors coupled to the first and second inputs of the voltage differentiator so as to generate voltage differentiation from current signals;

a floating capacitor coupled between the first and second outputs of the voltage differentiator, the floating capacitor forming a finite zero in the transfer function of the filter; and three integrators, a first integrator driving the first input of the voltage differentiator and a third integrator driving the second input of the voltage differentiator, the first and third integrator configured in a lossy configuration, a second integrator is driven by the voltage differentiation and is configured in a feedback configuration.

9. The filter of claim 8, further comprising current amplifiers coupled to an output of the second integrator, the current amplifiers are configured to scale the inputs of the first and third integrators such that the integrator functions are defined in terms of the same bias resistance of the voltage differentiator.

10. The filter of claim 9, wherein the current amplifiers are translinear current amplifiers.

11. The filter of claim 9, wherein an amplification factor of the current amplifiers is determined by the ratio of two input currents such that the amplification factor can be an integer and a non-integer value, and wherein at least one of the two inputs currents is externally supplied.

12. The filter of claim 9, further comprising third and fourth transistors on second branches coupled to the first and second transistors respectively and being substantially matched thereto and at least one current mirror isolated from the floating capacitor and coupled to the voltage differentiator and second branch transistors such that the at least one current mirror subtracts a non-linear signal from the associated second branched transistor to substantially cancel any signal non-linearities introduced by the emitter follower configuration.

13. The filter of claim 12, wherein the at least one current mirror includes two current mirrors coupled to drive each collector of the voltage differentiator transistors.

14. A current-mode filter with a transfer function having complex zeros, comprising:

a voltage differentiator having first and second bipolar transistors with respective first and second inputs and outputs and being coupled in an emitter follower configuration, third and fourth bipolar transistors on second branches are coupled to the first and second transistors respectively and are substantially matched thereto;

bias resistors coupled to the first and second inputs of the voltage differentiator so as to generate voltage differentiation from current signals;

a floating capacitor coupled between the first and second outputs of the voltage differentiator, the floating capacitor forming a finite zero in the transfer function of the filter;

three integrators, a first integrator driving the first input of the voltage differentiator and a third integrator driving the second input of the voltage differentiator, the first and third integrator configured in a lossy configuration, a second integrator is driven by the voltage differentiation and is configured in a feedback configuration;

current amplifiers coupled to an output of the second integrator, the current amplifiers are configured to scale the inputs of the first and third integrators such that the integrator functions are defined in terms of the same bias resistance of the voltage differentiator; and at least one current mirror isolated from the floating capacitor and coupled to the voltage differentiator and second branch transistors such that the at least one current mirror subtracts a non-linear signal from the associated second branched transistor to substantially cancel any signal non-linearities introduced by the emitter follower configuration.

15. The filter of claim 14, wherein the at least one current mirror includes two current mirrors coupled to drive each collector of the voltage differentiator transistors.

16. The filter of claim 14, wherein the current amplifiers are translinear current amplifiers having amplification factors determined by the ratio of two input currents such that the amplification factors can be an integer and a non-integer value, and wherein at least one of the two inputs currents is externally supplied.

* * * * *